United States Patent [19]

Keane et al.

[11] Patent Number: 4,670,351

[45] Date of Patent: Jun. 2, 1987

[54] FLEXIBLE PRINTED CIRCUITS, PREPARED BY AUGMENTATION REPLACEMENT PROCESS

[75] Inventors: John J. Keane, Ballston Lake; Thomas P. Wacker, Schenectady, both of N.Y.

[73] Assignee: General Electric Company, Waterford, N.Y.

[21] Appl. No.: 828,939

[22] Filed: Feb. 12, 1986

[51] Int. Cl.$^4$ ............................................. B22F 7/00
[52] U.S. Cl. ..................................... 428/549; 29/846; 156/297; 174/68.5; 361/398; 361/402; 361/411; 427/96; 427/98; 428/210; 428/447; 428/551; 428/901; 430/315; 430/319
[58] Field of Search ...................... 361/398, 402, 411; 29/846; 174/68.5; 428/901, 549, 210, 447, 551; 427/96, 98; 156/297; 430/315, 319

[56] References Cited

U.S. PATENT DOCUMENTS

| | | | |
|---|---|---|---|
| 3,925,578 | 12/1975 | Polichette et al. | 427/305 |
| 4,292,106 | 9/1981 | Herschdorfer et al. | 156/244.18 |
| 4,388,351 | 6/1983 | Sawyer | 427/304 |
| 4,395,459 | 7/1983 | Herschdorfer et al. | 428/392 |
| 4,411,980 | 10/1983 | Haney et al. | 427/98 |
| 4,460,427 | 7/1984 | Haney et al. | 427/98 |

*Primary Examiner*—Stephen J. Lechert, Jr.

[57] ABSTRACT

The present invention provides flexible printed circuits prepared by (i) applying a design on a silicone-impregnated fabric substrate with a printing ink comprising a mixture of (a) a curable silicone composition and (b) an effective amount of at least one finely divided metal powder; (ii) at least partially curing said silicone composition; and (iii) depositing a conductive metal on the surface of said printing ink.

20 Claims, No Drawings

FLEXIBLE PRINTED CIRCUITS, PREPARED BY AUGMENTATION REPLACEMENT PROCESS

BACKGROUND OF THE INVENTION

The present invention generally relates to flexible printed circuits useful at both very high and very low temperatures. More particularly, the present invention relates to flexible printed circuits wherein the substrate is a silicone impregnated fabric such as glass cloth and the printing ink is a silicone composition containing an amount of finely divided metal powder effective for carrying out an augmentation replacement reaction or other process for depositing a conductive metal on said printing ink.

U.S. Pat. No. 3,226,256 to Schneble, incorporated herein by reference, discloses flexible printed circuits prepared by (1) providing an insulating base having surface portions consisting essentially of an adhesive resinous bonding composition having dispersed therein finely divided metal particles of catalytic agent, said resinous bonding composition further comprising a thermosetting resin and a flexible adhesive resin, (2) curing the adhesive resinous bonding composition and (3) treating the resulting base with an electroless metal deposition bath to deposit metal directly on the cured adhesive resinous bonding composition so as to form a conducting pattern.

U.S. Pat. No. 4,404,237 to Eichelberger et al., assigned to the same assignee as the present invention and incorporated herein by reference in its entirety, discloses the formation of an electrical conductor by an augmentation replacement reaction. Briefly, Eichelberger et al. provide a process wherein the desired conductive design is applied to a substrate with an ink composition which comprises a finely divided metal powder, a curable polymer, and a solvent. The curable polymer is at least partially cured and then the resulting ink pattern is contacted with a metal salt solution in which the metal cation is more noble (electropositive) than the metal of the finely divided powder, and the anion forms a salt with the metal of the salt and the powder which is soluble in the solution.

SUMMARY OF THE INVENTION

It is an object of the present invention to provide flexible printed circuits capable of being used at both very high temperatures and very low temperatures, such as in aerospace applications.

In accordance with one aspect of the present invention flexible printed circuits are provided by (i) applying a design on a silicone-impregnated fabric substrate with a printing ink comprising a mixture of (a) a curable silicone composition and an effective amount of at least one finely divided metal powder; (ii) at least partially curing said silicone composition; and (iii) depositing a conductive metal on the surface at said printing ink.

An especially preferred embodiment employs silicone-impregnated glass cloth as the substrate and a heat curable silicone composition containing finely divided iron, nickel, zinc or mixture thereof, as the printing ink. The conductive metal can be deposited on the printing ink by an augmentation replacement reaction, by an electroless plating bath or by electrodeposition.

DESCRIPTION OF THE INVENTION

The base fabric material of the substrate can be any suitable composition. It may be made from a natural fiber such as cotton, a synthetic fiber such as polyester, nylon, or glass fabric, or mixtures of such fibers, depending on the properties which are desired. Cotton constructions absorb moisture and withstand relatively high temperatures without damage. Polyester produces fibers that are smooth, crisp and resilient, and since moisture does not penetrate polyester, it does not affect the size or shape of the fiber. Nylon is the strongest of the commonly used fibers, and it is both elastic and resilient so that articles made with nylon will return to their original shape. Glass fibers offer very low elongation and very high strength and hence are especially useful in the practice of the present invention.

The base fabric material can be of any suitable type such as woven, knitted or nonwoven. Woven fabrics have three basic constructions, the plain weave, the twill weave and the satin weave. The plain weave is by far the strongest because it has the tightest interlacing of fibers and, accordingly, is used most often. Knitted fabrics are used where moderate strength and considerable elongation are required. Nonwoven textile fabrics are porous materials composed primarily of fibers and are manufactured by processes other than spinning, weaving, knitting or knotting. A few basic elements can be varied and controlled to produce a great range of nonwoven fabric materials. Experience thus far has been that fiberglass fabric is particularly preferred as the base fabric material for the substrate of the present invention.

The silicone used to impregnate the aforesaid base fabric material can be any suitable silicone composition and includes all of the silicone compositions described more fully hereinbelow.

The curable silicone polymer of the printing ink must be compatible with the silicone used to impregnate the base fabric material of the substrate as well as with the finely divided metal powder. Furthermore, the curable silicone polymer of the printing ink must be capable of use in printing and application techniques such as screen printing, pad flexographic printing, stencil, rotogravure, offset printing, and the like.

Preferably, both the silicone used to impregnate the base fabric material and the curable silicone polymer of the printing ink are based on addition curable elastomeric compositions comprising (a) an organopolysiloxane containing alkenyl unsaturation, (b) an organohydrogenpolysiloxane crosslinking agent, and (c) a hydrosilation catalyst. Such addition curable silicone compositions are well known in the art, for example, as described in U.S. Pat. Nos. 3,020,260 and 3,436,366, both of which are incorporated by reference into the instant disclosure.

It is especially preferred that the curable silicone polymer of the printing ink be an addition curable composition which includes an adhesion promoter and/or a cure inhibitor, for example, as taught in U.S. Pat. Nos. 4,340,710 to Brown, 4,329.273 to Hardman et al., and 4,256,870 to Eckberg, all of which are assigned to the same assignee as the present invention and incorporated herein by reference. Other suitable addition curable silicone compositions will be obvious to those skilled in the silicone art or can be ascertained without undue experimentation.

Another class of suitable silicone compositions is based upon curing via a fre radical mechanism upon exposure to elevated temperatures, i.e. heat curable silicone compositions. Such compositions comprise (a)

an organopolysiloxane polymer and (b) a catalyst which generates free radicals upon heating to a temperature of about 100° C. Particularly preferred heat curable silicone compositions are described in U.S. Pat. Nos. 3,730,932 and 3,813,364 to DeZuba, both of which are assigned to the same assignee as the present invention and incorporated herein by reference. Other variations of heat curable silicone compositions will be apparent to the artisan and their suitability for use in the present invention determined without undue experimentation.

Somewhat less preferred for use in the printing ink, but equally as preferred for impregnating the fabric material of the substrate, are condensation curable silicone compositions comprising (a) an organopolysiloxane polymer containing at least two terminal hydrolyzable groups at each polymer chain end, and (b) a condensation catalyst. Component (a) can, of course, be replaced with a combination of an organopolysiloxane containing a single hydrolyzable group at each polymer chain end and a silane crosslinking agent containing three or four hydrolyzable groups. Such condensation curable silicone compositions are often referred to as room temperature vulcanizable (RTV) compositions and are well known in the art. Especially preferred silicone RTV compositions are described in U.S. Pat. Nos. 4,395,526 to White et al., 4,417,042 to Dziark, and 4,483,973 to Lucas et al., all of which are assigned to the same assignee as the present invention and incorporated herein by reference.

In practicing the present invention a printing ink is prepared by combining the curable silicone composition with at least one finely divided metal powder. The metal can be any metal which is stable in the ink and cured polymer, can be obtained in finely divided form, and, in the case where the conductive metal is to be deposited by an augmentation replacement reaction, is placed above the metal used in the augmentation replacement reaction in the activity series of the metals. Because of their availability and low cost, the most preferred metals are iron, nickel and zinc or a mixture thereof. The metal powder generally has a particle size less than about 50 microns, preferably less than about 25 microns, and most preferably less than about 10 microns. The finely divided metal powder should constitute at least about 50% by volume based on the volume of curable silicone polymer, of the mixture. Excellent results have been obtained when the finely divided metal powder ranges from about 60% to about 80% by volume of the mixture. When an augmentation replacement reaction is to be employed, a significant amount of metal particles should be on the surface of the at least partially cured ink so as to facilitate deposition of the metal of the augmentation replacement solution.

As can easily be appreciated, it is preferred that addition curable compositions containing a cure inhibitor or heat curable compositions be employed in the printing ink so that sufficient time is available for mixing the curable composition with the finely divided metal powder and for applying the printing ink to the substrate. The polymers and inks employed in the present invention can contain various other materials such as fillers, dyes, pigments, waxes, stabilizers, lubricants, polymerization inhibitors, wetting agents, adhesion promoters, and the like.

The printing ink can be applied to the silicone-impregnated fabric by any suitable means such as screen printing, pad flexographic printing, stencil, rotogravure, offset printing, or the like. When the ink is deposited by screen printing, which is the preferred method, the metal particles must be of a size to pass through the screen.

If desired, a solvent may be included in the ink formulation in order to adjust the viscosity and flow characteristics for the type of printing desired. In general, the solvent should be employed in an amount sufficient to adjust the ink's viscosity from about 15,000 centipoise to about 200,000 centipoise at 25° C. Suitable solvents or diluents include aliphatic and aromatic hydrocarbons containing up to about 30 carbon atoms. It is preferred to employ a solvent which is relatively nonvolatile at room temperature so that the viscosity and flow of the ink are appropriate during application to the substrate, and highly volatile at the curing temperature of the silicone composition or at other temperatures above the application temperature.

The ink is applied to the substrate to achieve the desired conductor patterns thereon. For example, standard printed circuit application technology can be employed. Any temperature which will not cause premature curing of the ink can be used to apply the ink design.

Following application, the ink is at least partially cured by the most convenient method. If a condensation curable silicone composition is used, the ink will cure by itself with no additional initiation, In the case of ultraviolet light curable silicones, the substrates carrying the conductor patterns are passed under a high intensity ultraviolet light source. It is presently preferred to utilize an addition curable silicone composition or a heat curable silicone composition. Most preferably, an addition curable silicone composition is utilized. As a result of this step, a closely compacted metal powder bound to the substrate by the cured silicone composition is achieved. Because of the high percentage of metal powder, the conductive pattern thus obtained may have some conductivity due to physical contact between the metal particles.

The ink-designed substrate is then preferably subjected to an augmentation replacement reaction in which some of the metal powder is replaced by a metal further down in the activity series, i.e., which is more noble. This step takes advantage of the known chemical behavior of metals—that any metal will displace any succeeding, less active metal from an aqueous solution of one of its salts. Eichelberger et al., U.S. Pat. No. 4,404,237, assigned to the same assignee as the present invention and incorporated herein by reference, found that while the powder metal enters into solution from the surface and somewhat below the surface of the polymer, the plating out of the more noble metal takes place, to a large extent, on the surface of the polymer. Thus, an additional amount of noble metal is deposited on the surface than that which would form a one-to-one exchange with the powder metal at the surface. The additional metal from the solution plates to both the original and replacement metal particles which are adhered to the substrate by the silicone composition, to interconnect all metal particles at the surface and thus form a contiguous film of conductive metal over the printed conductor pattern.

The augmentation reaction reagent is a solution, preferably inorganic and most preferably aqueous, of a metal salt. The cation of the metal salt can be any more noble or electropositive metal than the metal of the finely divided metal powder. Any anion can be used which is relatively inert, i.e., does not deleteriously affect the process and which forms soluble salts with both the cation metal and the powder metal. Typical salts include copper nitrate, copper acetate, copper fluoroborate, potassium gold cyanide, nickel sulfate, nickel chloride, nickel sulfamate, potassium silver cyanide, silver chloride, and the like. The concentration of the metal salt in the solution can range from 0.1 molar to saturation but is preferably about 0.5 molar to about 2.0 molar. The augmentation replacement reaction can be carried out at any suitable temperature although elevated temperatures are generally preferred in order to increase the reaction rate. Thus, any temperature from ambient up to about 100° C. can be employed although the temperature preferably is from about 45° C. to about 60° C. Generally, the augmentation reaction is completed in about 2 to about 20 minutes or more. Five minutes is usually adequate to obtain suitable results.

The thickness of the more noble metal applied by the augmentation replacement reaction can be increased, if desired, in accordance with the copending patent application of J. J. Keane, filed Dec. 30, 1985, attorney docket number 60SI-973, and assigned to the same assignee as the present invention.

Rather than depositing the conductive metal by an augmentation replacement reaction, it is also within the scope of the present invention to effect such deposition by immersing the printed substrate in a conventional electroless plating bath. Electroless plating is well known in the art and is described generally in "Encyclopedia of Chemical Technology", Third Edition, Vol. 8, pages 738-750, John Wiley and Sons, 1979. Briefly, electroless plating solutions contain a metal salt of the metal to be plated, a reducing agent, a pH adjuster or buffer, a complexing agent, and one or more additives to control stability, film properties, deposition rates, and the like. Of course, the metal salt and reducing agent must be replenished at periodic intervals because they are consumed during the plating process. Preferred plating baths utilize copper salts and are described in U.S. Pat. Nos. 2,874,072; 2,938,805; 2,996,408; 3,075,855; 3,075,856; and 3,649,350, all of which are incorporated by reference into the present disclosure. Additional patents describing bath stabilizers as well as physical property improvers and deposition aids are compiled in "Plating of Plastics With Metals", John McDermott, pages 62-93, Noyes Data Corporation, 1974. Patents directed to the preparation of printed circuits by electroless plating are compiled at pages 227-271 of the aforesaid McDermott reference.

Another contemplated, though less preferable, method for depositing a conductive metal on the surface of the printing ink, is electrodeposition. Electrodeposition is also a well known technique for depositing a metal coating and is described generally in "Encyclopedia of Chemical Technology", Third Edition, Vol. 8, pages 826-869, John Wiley and Sons, 1979. The artisan will appreciate that the primary disadvantage of electrodeposition is the need to connect all of the individual sections of the conductive pathways provided during the printing step.

In order that those skilled in the art may better understand our invention, the following example is given by way of illustration and not by way of limitation. All parts and percentages are by weight unless otherwise stated.

EXAMPLE

A printing ink was prepared by mixing 12 grams RTV 615A and 1.2 grams RTV 615B (available from General Electric Company), 90 grams of a blend of finely divided iron and nickel and 10.5 grams Solvesso 100. The thus prepared ink was screen printed onto a silicone impregnated glass cloth and cured by heating for 15 minutes at 150° C. An augmentation replacement reaction was then conducted in accordance with U.S. Pat. No. 4,404,237 to Eichelberger by immersing the printed substrate in an aqueous bath containing a copper salt. The resulting printed circuit, having conductive copper pathways about 200 microinches in thickness, was then immersed in a MacDermid Macuplex electroless copper coating bath comprising:

1710 ml deionized water
200 ml Macuplex 7921 copper complexor solution
60 ml Macuplex 7920 copper/formaldehyde solution
28 ml Macuplex 7922 caustic solution
2 ml Macuplex 7924 cyanide solution
9 grams Macuplex 7923 formaldehyde solution.

The copper of the electroless plating bath deposited on the copper of the augmentation replacement reaction to provide conductive copper pathways about 1.5 mils in thickness.

We claim:

1. A flexible printed circuit prepared by a method comprising:
    (i) applying a design on the silicone-impregnated fabric substrate with a printing ink comprising a mixture of (a) a curable silicone composition and (b) an effective amount of at least one finely divided metal powder;
    (ii) at least partially curing said silicone composition; and
    (iii) depositing a conductive metal on the surface of said printing ink.

2. A flexible printed circuit as in claim 1, wherein the substrate is silicone-impregnated glass cloth.

3. A flexible printed circuit as in claim 1 or 2, wherein the curable silicone composition of the printing ink is an addition curable silicone composition.

4. A flexible printed circuit as in claim 1 or 2, wherein the curable silicone composition of the printing ink is a heat curable silicone composition.

5. A flexible printed circuit as in claim 1 or 2, wherein the curable silicone composition of the printing ink is a condensation curable silicone composition.

6. A flexible printed circuit as in claim 3, wherein the finely divided metal powder has a particle size less than about 50 microns.

7. A flexible printed circuit as in claim 4, wherein the finely divided metal powder has a particle size less than about 50 microns.

8. A flexible printed circuit as in claim 5, wherein the finely divided metal powder has a particle size less than about 50 microns.

9. A flexible printed circuit as in claim 6, wherein the finely divided metal powder is iron, nickel, or zinc or a mixture thereof.

10. A flexible printed circuit as in claim 7, wherein the finely divided metal powder is iron, nickel, or zinc or a mixture thereof.

11. A flexible printed circuit as in claim 8, wherein the finely divided metal powder is iron, nickel, or zinc or a mixture thereof.

12. A flexible printed circuit as in claim 9, wherein the conductive metal is copper.

13. A flexible circuit as in claim 10, wherein the conductive metal is copper.

14. A flexible printed circuit as in claim 11, wherein the conductive metal is copper.

15. A flexible printed circuit as in claim 1, wherein the design is applied to the silicone-impregnated fabric substrate by screen printing.

16. A flexible printed circuit as in claim 1, wherein the finely divided metal powder is from about 60% to about 80% by volume of the printing ink mixture.

17. A flexible printed circuit as in claim 1, wherein the conductive metal is deposited on the surface of the printing ink by an augmentation replacement reaction.

18. A flexible printed circuit as in claim 1, wherein the conductive metal is deposited on the surface of the printing ink by an electroless plating process.

19. A flexible printed circuit as in claim 1, wherein the conductive metal is deposited on the surface of the printing ink by an electrodeposition process.

20. A method for making a flexible printed circuit, comprising:
   (i) applying a design on a silicone-impregnated fabric substrate with a printing ink comprising a mixture of (a) a curable silicone composition and (b) an effective amount of at least one finely divided metal powder;
   (ii) at least partially curing said silicone composition; and
   (iii) depositing a conductive metal on the surface of said printing ink.

* * * * *